US008659356B2

(12) United States Patent
Qian

(10) Patent No.: US 8,659,356 B2
(45) Date of Patent: Feb. 25, 2014

(54) POWER SUPPLY CIRCUIT OF POWER AMPLIFIER, AND TERMINAL

(75) Inventor: Zexu Qian, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 112 days.

(21) Appl. No.: 13/351,999

(22) Filed: Jan. 17, 2012

(65) Prior Publication Data

US 2012/0188017 A1 Jul. 26, 2012

(30) Foreign Application Priority Data

Jan. 21, 2011 (CN) .......................... 2011 1 0024175

(51) Int. Cl.
*H03G 3/00* (2006.01)

(52) U.S. Cl.
USPC ............. 330/127; 330/297; 330/96; 455/572; 323/282

(58) Field of Classification Search
USPC .............. 330/127, 297, 96; 455/572; 323/282
See application file for complete search history.

(56) References Cited

U.S. PATENT DOCUMENTS

| 6,329,727 | B1 | 12/2001 | Traveis et al. | |
|---|---|---|---|---|
| 6,374,127 | B1 | 4/2002 | Park | |
| 8,169,201 | B2 * | 5/2012 | Chung et al. | 323/268 |
| 8,195,102 | B2 * | 6/2012 | Collados et al. | 455/102 |
| 2003/0107440 | A1 | 6/2003 | Miki et al. | |
| 2004/0183512 | A1 | 9/2004 | McCune | |
| 2004/0192408 | A1 | 9/2004 | Sharp et al. | |
| 2006/0128324 | A1 * | 6/2006 | Tan et al. | 455/127.1 |
| 2007/0182490 | A1 | 8/2007 | Hau et al. | |

FOREIGN PATENT DOCUMENTS

| CN | 1236217 A | 11/1999 |
|---|---|---|
| CN | 201398189 Y | 2/2010 |
| CN | 101694962 A | 4/2010 |
| CN | 102158078 A | 8/2011 |
| JP | 62-216012 A | 9/1987 |
| JP | 6-303061 A | 10/1994 |
| JP | 2002290247 A | 10/2002 |
| JP | 2007318654 A | 12/2007 |
| JP | 2008066867 A | 3/2008 |
| WO | WO 2008/135637 A1 | 11/2008 |

OTHER PUBLICATIONS

Office Action issued in corresponding Chinese Patent Application No. 201110024175.2, mailed Oct. 23, 2012.
International Search Report issued in corresponding PCT Patent Application No. PCT/CN2012/070600, mailed Apr. 5, 2012.
Extended European Search Report issued in corresponding European Patent Application No. 12151910.2, mailed Jun. 14, 2012.
Office Action issued in corresponding Japanese Patent Application No. 2012-554212, mailed Oct. 22, 2013, 9 pages.

* cited by examiner

*Primary Examiner* — Patricia Nguyen
(74) *Attorney, Agent, or Firm* — Brinks Gilson & Lione

(57) ABSTRACT

Embodiments of the present invention a power supply circuit of a power amplifier and a terminal, relating to the communication field. The power supply circuit of the power amplifier includes a direct current/direct current converter chip, where the direct current/direct current converter chip includes an input pin, an inductance pin, and a feedback pin, and the input pin is connected to a power supply and the inductance pin is connected to a voltage input end of the power amplifier through an LC storage circuit. A control circuit is connected between the voltage input end of the power amplifier and the feedback pin; the control circuit includes a control voltage, where the control voltage adjusts the voltage at the voltage input end of the power amplifier through the control circuit and the control voltage is variable.

17 Claims, 9 Drawing Sheets

POWER SUPPLY CIRCUIT OF POWER AMPLIFIER, AND TERMINAL

CROSS-REFERENCE TO RELATED APPLICATION

This application claims priority to Chinese Patent Application No. 201110024175.2, filed on Jan. 21, 2011, which is hereby incorporated by reference in its entirety.

FIELD OF THE INVENTION

The present invention relates to the communication field, and in particular, to a power supply circuit of a power amplifier and to a terminal.

BACKGROUND OF THE INVENTION

With the rapid development of mobile communication technologies, more and more users use wireless data services for communication. At present, terminals supporting wireless data services mainly include: a wireless data card and a mobile phone.

During the uplink transmission process of signals transmitted by a terminal, radio frequency signals are amplified by a PA (Power Amplifier, power amplifier, power amplifier for short) and amplified radio frequency signals are then transmitted by an antenna to the space. The PA is a major power-consuming element during the uplink transmission process of the terminal. If the efficiency of the PA is low, the power consumption of the entire equipment will be large. The power supply circuits of two types of terminals in the prior art are introduced respectively in the following.

As shown in FIG. 1, in a power supply circuit of a PA in a battery-powered terminal such as a mobile phone, $V_{BAT}$ is an output voltage, and the voltage is stable in the range of 3.7V~4.2V, where the voltage is used as the power supply voltage of the PA.

As shown in FIG. 2, in a commonly used power supply circuit of a PA in a wireless data card, U1 is a direct current/direct current converter chip (that is, a DC/DC switch power chip). $V_{IN}$ is a working power supply of the wireless data card, where the power supply is provided by a portable computer through commonly-used peripheral interfaces, such as a USB (Universal Serial Bus, universal serial bus) interface, a PCM-CIA (Personal Computer Memory Card International Association, Personal Computer Memory Card International Association) interface, or an ExpressCard interface.

$$V_{OUT} = \left(1 + \frac{R_1}{R_2}\right) \cdot V_{FB}$$

is a power supply voltage of the PA, and $V_{FB}$ is a feedback reference value of the DC/DC switch power chip, where the value is a fixed value. Obviously, after $R_1$ and $R_2$ are fixed, the power supply voltage $V_{OUT}$ of the PA is also a fixed value.

In the prior art, the power supply voltage of the PA is constant. In practical application, the required output power of the PA changes along with a change of the network state of the terminal. It is known from properties of the PA that, under a prerequisite that the entire equipment satisfies a radio frequency index, if a required output power of the PA is reduced, the power supply voltage of the PA is reduced as well. In this case, the closer the actual power supply voltage of the PA is to the required output power of the PA, the higher the efficiency of the PA is. In addition, the PA has certain discreteness, and under the prerequisite that the entire equipment satisfies the radio frequency index, the required power supply voltage of the PA is different. However, in the prior art, the power supply voltage of the PA is a constant value and cannot change according to the change of the required power supply voltage, which thereby causes that the efficiency of the PA is low and the power consumption of the entire equipment is large.

SUMMARY OF THE INVENTION

Embodiments of the present invention provide a power supply circuit of a power amplifier and provide a terminal, so as to improve the efficiency of the power amplifier in the terminal and reduce power consumption of the terminal.

To achieve the above objective, the following technical solutions is adopted in the embodiments of the present invention:

A power supply circuit of a power amplifier, includes a direct current/direct current converter chip, where the direct current/direct current converter chip includes an input pin, an inductance pin, and a feedback pin, where the input pin is configured to be connected to the power supply and the inductance pin is connected to a voltage input end of the power amplifier through an LC storage circuit, and in addition, a control circuit is connected between the voltage input end of the power amplifier and the feedback pin; and the control circuit includes a control voltage, where the control voltage adjusts the voltage at the voltage input end of the power amplifier through the control circuit; and the control voltage is variable.

A terminal includes a baseband processing unit, a power amplifier and a power supply circuit of the power amplifier, where the power supply circuit of the power amplifier includes a direct current/direct current converter chip, and the direct current/direct current converter chip includes an input pin, an inductance pin, and a feedback pin, where the input pin is configured to be connected to the power supply and the inductance pin is connected to the voltage input end of the power amplifier through an LC storage circuit, and in addition, a control circuit is connected between the voltage input end of the power amplifier and the feedback pin, and the control circuit includes a control voltage; and the baseband processing unit is configured to adjust the control voltage, where the control voltage adjusts through the control circuit the voltage at the voltage input end of the power amplifier.

According to the power supply circuit of the power amplifier and the terminal provided in the embodiments of the present invention, a control circuit is additionally set between the voltage input end of the power amplifier and the feedback pin of the direct current/direct current converter chip, and a variable control voltage is introduced to the control circuit. The control voltage may adjust through the control circuit the voltage at the voltage input end of the power amplifier so that the voltage at the voltage input end of the power amplifier changes according to actual requirements. Thereby, the efficiency of the power amplifier may be improved and then the power loss of the terminal is reduced.

BRIEF DESCRIPTION OF THE DRAWINGS

To illustrate the technical solutions provided in embodiments of the present invention or the prior art more clearly, accompanying drawings to be used for description of the embodiments of the present invention or the prior art are briefly introduced below. Apparently, the accompanying drawings are only some of the embodiments of the present invention, and persons of ordinary skill in the art can derive other drawings from these accompanying drawings without any creative effort.

DETAILED DESCRIPTION OF THE EMBODIMENTS

The technical solutions in embodiments of the present invention are described clearly and completely below with reference to accompanying drawings in the embodiments of the present invention. Evidently, the embodiments are only part rather than all of the embodiments of the present invention. All other embodiments derived by persons of ordinary skill in the art without any creative effort shall fall within the protection scope of the present invention.

Figure 1:
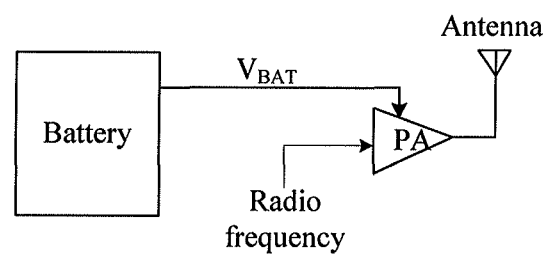
FIG. 1 is a circuit diagram of a power supply circuit of a power amplifier according to the prior art.
Figure 2:
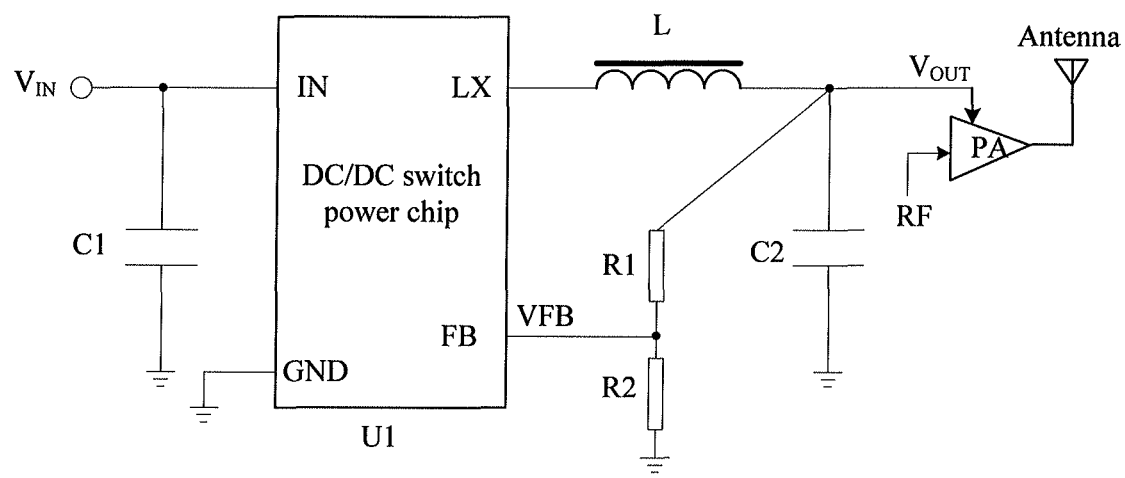
FIG. 2 is a circuit diagram of another power supply circuit of a power amplifier according to the prior art.
Figure 3:
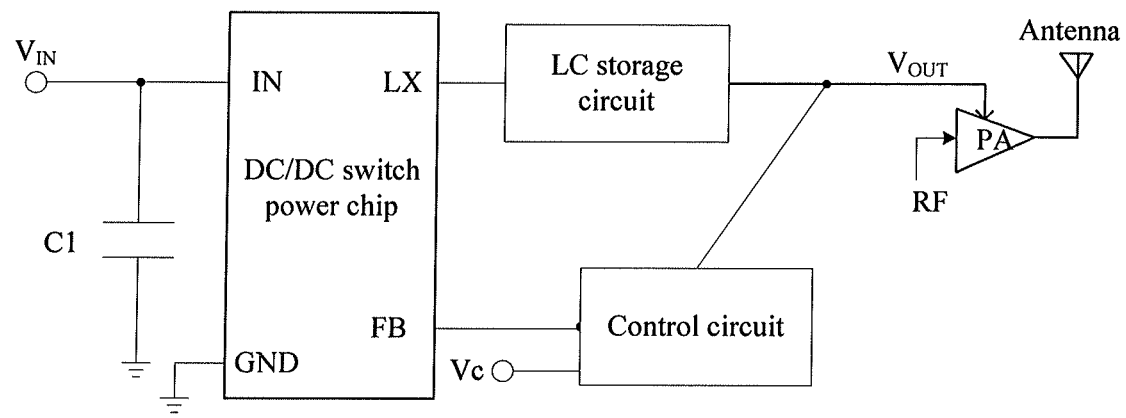
FIG. 3 is a schematic circuit diagram of a power supply circuit of a power amplifier according to an embodiment of the present invention.

To improve the efficiency of the power amplifier, an embodiment of the present invention provides a power supply circuit of a power amplifier. As shown in FIG. 3, the power supply circuit includes a direct current/direct current converter chip (that is, a DC/DC switch power chip). The direct current/direct current converter chip includes an input pin IN, an inductance pin LX, and a feedback pin FB. The input pin IN is connected to a power supply $V_{IN}$, and the inductance pin LX is connected to a voltage input end of the power amplifier, PA, through an LC storage circuit. A control circuit is connected between the voltage input end of the power amplifier, PA, and the feedback pin FB.

The control circuit includes a control voltage $V_c$, where the control voltage $V_c$ adjusts, through the control circuit, the voltage $V_{OUT}$ at the voltage input end of the power amplifier, PA, and the control voltage Vc is variable.

In the power supply circuit of the power amplifier provided in the embodiment of the present invention, the control circuit is additionally set between the voltage input end of the power amplifier and the feedback pin of the DC/DC converter chip, and the variable control voltage is introduced to the control circuit. The control voltage may adjust, through the control circuit, the voltage at the voltage input end of the power amplifier, so that the voltage at the voltage input end of the PA changes according to actual requirements. That is to say, when the power amplifier requires only a voltage with a relatively small value at the voltage input end to work normally, the control voltage may adjust, through the control circuit, the voltage at the voltage input end of the power amplifier to the relatively small value. In this way, the efficiency of the PA may be improved.

The above-mentioned power supply circuit of the power amplifier may be applied to a terminal.

Further, in the power supply circuit of the power amplifier, a corresponding relationship exists between the control voltage Vc, the power rating of the power amplifier PA, and working frequency point of the power amplifier PA. Specifically, reference may be made to Table 1.

TABLE 1

| Power Rating | Working Frequency | | | |
|---|---|---|---|---|
| | F1 | F2 | ... | Fn |
| | | Control Voltage Vc | | |
| P1 | V11 | V12 | ... | V1n |
| P2 | V21 | V22 | ... | V2n |
| ... | ... | ... | ... | ... |
| Pm | Vm1 | Vm2 | ... | Vmn |

The working frequency points of the power amplifier PA are n (n≥1) frequency points that are obtained by dividing the radio frequency that is input to the power amplifier, and m power ratings may be set under each working frequency point. The power ratings may be divided according to the value of the output power of the power amplifier. A certain power rating of a working frequency point of the power amplifier PA is referred to as a state of the power amplifier PA. When the terminal including the above power supply circuit of the PA is working normally, the power rating of the PA and/or working frequency point of the PA changes in real time. Table 1 records the value of the control voltage Vc corresponding to the power amplifier PA in each state. That is to say, the control voltage Vc may change according to a change of the power rating of the power amplifier PA and/or working frequency point of the power amplifier PA. In addition, the control voltage Vc may adjust, through the control circuit, the voltage $V_{OUT}$ at the voltage input end of the power amplifier PA, so that the voltage $V_{OUT}$ at the voltage input end of the PA may change along with the change of the power rating of the power amplifier PA and/or working frequency point of the power amplifier PA. In this embodiment, under the prerequisite that the terminal (entire equipment) satisfies the radio frequency index, the smaller the voltage $V_{OUT}$ at the voltage input end of the power amplifier PA, the better. In this way, the efficiency of the power amplifier is improved.

It should be noted that in the WCDMA (Wideband Code Division Multiple Access, Wideband Code Division Multiple Access) standard, the radio frequency index includes: ACLR (Adjacent Channel Leakage Ratio, adjacent channel leakage ratio), and output power of the power amplifier PA and sensitivity of the power amplifier PA. In the CDMA2000 (Code Division Multiple Access 2000, Code Division Multiple Access 2000) standard, the radio frequency index includes: ACPR (Adjacent Channel Power Ratio, adjacent channel power ratio), and output power of the power amplifier PA and sensitivity of the power amplifier PA.

In the following, as regards how to determine the control voltage Vc of the PA in each state listed in Table 1, during manufacture, the method shown in FIG. 4 may be used for calibrating the value of the Vc and the Vc obtained through calibration is recorded in Table 1.

401: Select a power rating of the PA, for example, P1 in Table 1.

402: Select a working frequency point at this power rating (P1), for example, F1 in Table 1.

403: Select the Vc corresponding to the minimum $V_{OUT}$ enabling the PA to work in the state (for example, the state of P1 and F1 in Table 1).

404: Judge whether the entire equipment satisfies the radio frequency index.

Specifically, the power supply circuit of the PA in the terminal adjusts the value of the $V_{OUT}$ by using the Vc in step 403. Under a condition that the PA is powered by using the $V_{OUT}$, the radio frequency index of the entire equipment is tested and it is judged whether the equipment satisfies the radio frequency index.

If the equipment satisfies the radio frequency index, step 405 is performed; if the equipment does not satisfy the radio frequency index, the value of the Vc in step 403 is increased and step 404 is repeated.

405: Save the value of the Vc meeting the requirement, that is, $V_{11}$ in Table 1.

At this time, scanning of a working frequency point (for example, F1) at the power rating (P1) is completed, and step 406 may be performed.

406: Judge whether scanning of all working frequency points at the power rating (P1) is completed.

If the scanning is completed, step 407 is performed; if the scanning is not completed the process returns to step 403 and a Vc corresponding to a next frequency point (for example, F2) is calibrated.

407: Judge whether the power rating (P1) is the last power rating, that is, whether scanning of all power ratings is completed.

If the scanning is completed, calibration of the Vc corresponding to each working frequency point at different power ratings of the PA is completed and then the Vc obtained through calibration is saved in Table 1.

If the scanning is not completed, the process returns to step 402. The Vc corresponding to a working frequency point at a next power rating (P2) is selected and calibrated until all the values of Vc in Table 1 are calibrated.

The above calibration process for the Vc may be performed by a computer having calibration software installed.

To shorten calibration time, calibration times may be reduced. That is to say, the corresponding Vc of the power amplifier PA only in some states is calibrated; and for the corresponding Vc values of the PA in other states, the optimal values of the Vc of the PA in other states may be obtained through a certain interpolation algorithm.

It should be noted that the above method for calibrating the Vc is a specific implementation to implement calibration of the Vc of the power amplifier PA in different states. The calibration method in this embodiment is not limited thereto, as long as the method may achieve the same objective.

Embodiment 1

Figure 5:
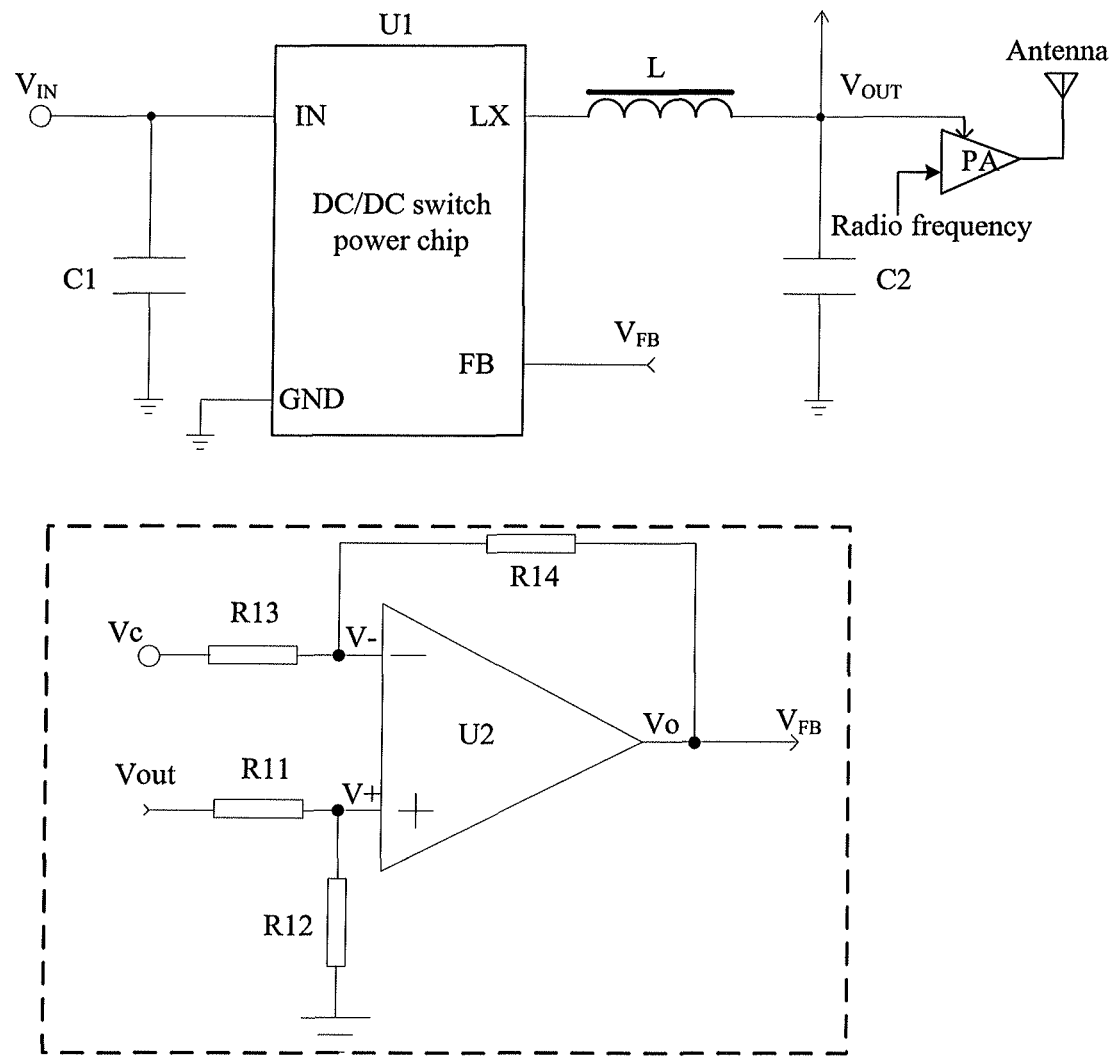
FIG. 5 is a circuit diagram of a power supply circuit of a power amplifier according to embodiment 1 of the present invention.

As shown in FIG. 5, this embodiment provides a specific implementation of a power supply circuit of a power amplifier.

The power supply circuit of the power amplifier includes a direct current/direct current converter chip U1. The DC/DC converter chip U1 includes an input pin IN, an inductance pin LX, and a feedback pin FB. The input pin IN is connected to a power supply $V_{IN}$ and the inductance pin LX is connected to a voltage input end of the power amplifier PA through an LC storage circuit. A control circuit is connected between the voltage input end of the power amplifier PA and the feedback pin FB.

The control circuit is marked by a dotted box in FIG. 5. The control circuit includes a control voltage Vc, where the control voltage Vc adjusts, through the control circuit, the voltage $V_{OUT}$ at the voltage input end of the power amplifier PA, and the control voltage Vc is variable. Specifically, the control voltage Vc may be adjusted according to the corresponding relationship between the control voltage Vc, the power rating of the power amplifier PA and working frequency point of the power amplifier PA, where the corresponding relationship is recorded in Table 1.

In addition, the LC storage circuit includes an inductance L and a capacitor C2. The inductance L is connected to the inductance pin LX of the direct current/direct current converter chip U1 and the voltage input end of the power amplifier PA, and the voltage input end of the power amplifier PA is grounded through the capacitor C2.

In this embodiment, the control circuit includes a differential amplifier circuit, and the differential amplifier includes an operational amplifier U2.

A non-inverting input end of the operational amplifier U2 is connected to the voltage input end of the power amplifier PA through a first resistor R11, and the non-inverting input end is grounded through a second resistor R12.

The control voltage Vc is applied to the inverting input end of the operational amplifier U2 through a third resistor R13, and the inverting input end is connected to the output end of the operational amplifier U2 through a fourth resistor R14, which forms a feedback loop.

The output end of the operational amplifier U2 is connected to the feedback pin FB of the direct current/direct current converter chip U1.

According to the above design of the power supply circuit of the power amplifier, the following relational expressions may be obtained. In the relational expressions, $V_-$ indicates the voltage at the inverting input end of the operational amplifier U2, $V_+$ indicates the voltage at the non-inverting input end of the operational amplifier U2, and Vo indicates the voltage at the output end of the operational amplifier U2.

$$\begin{cases} V_+ = \dfrac{R12}{R11+R12} V_{OUT}; \\ \dfrac{Vc - V_-}{R13} = \dfrac{V_- - Vo}{R14}; \\ V_+ = V_-; \\ Vo = V_{FB}; \end{cases}$$

From the above expressions, a relational expression between $V_{OUT}$ and Vc is finally obtained:

$$V_{OUT} = \frac{R14(R11+R12)}{R12(R13+R14)} Vc + \frac{R13(R11+R12)}{R12(R13+R14)} V_{FB} \quad \text{①}$$

In the expression ①, $V_{FB}$ is a fixed value. Therefore, it is easy to find that $V_{OUT}$ is in a linear relationship with Vc.

Figure 6:
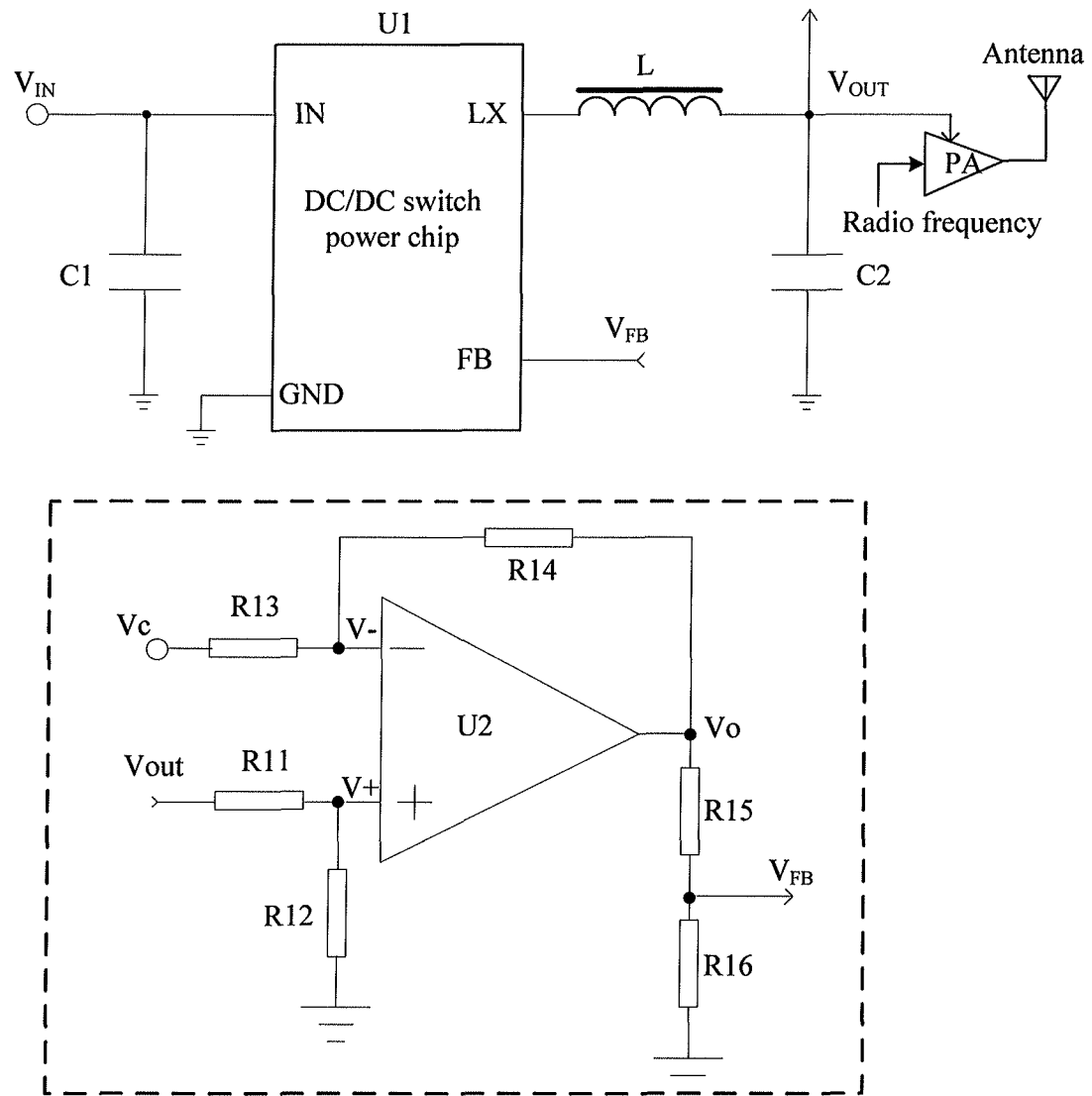
FIG. 6 is a circuit diagram of another power supply circuit of a power amplifier according to embodiment 1 of the present invention.

Further, referring to FIG. 6, the differential amplifier circuit in the power supply circuit of the power amplifier shown in FIG. 5 is optimized. The output end of the operational amplifier U2 is connected to the feedback pin FB of the DC/DC converter chip U1 through a resistor R15, and the feedback pin FB is grounded through a resistor R16.

In this case, the following relational expressions may be obtained:

$$\begin{cases} V_+ = \dfrac{R12}{R11+R12} V_{OUT}; \\ \dfrac{Vc - V_-}{R13} = \dfrac{V_- - Vo}{R14}; \\ V_+ = V_-; \\ V_{FB} = \dfrac{R16}{R15+R16} Vo; \end{cases}$$

From the above expressions, the following expression between $V_{OUT}$ and Vc may be obtained:

$$V_{OUT} = \frac{R14(R11+R12)}{R12(R13+R14)} Vc + \frac{R13(R11+R12)(R15+R16)}{R12 \cdot R16(R13+R14)} V_{FB} \quad ②$$

In the expression ②, $V_{FB}$ is a fixed value. Therefore, it is easy to find that $V_{OUT}$ is in a linear relationship with Vc.

Further, in the design of the differential amplifier circuit, generally, the resistance of the first resistor R11 is equal to that of the third resistor R13, and the resistance of the second resistor R12 is equal to that of the fourth resistor R14.

In this case, as regards the power supply circuit of the power amplifier shown in FIG. 6, a relational expression between $V_{OUT}$ and the Vc may be obtained:

$$V_{OUT} = Vc + \frac{R13(R15+R16)}{R12 \cdot R16} V_{FB} \quad ③$$

In the expression ③, $V_{FB}$ is a fixed value. Therefore, it may be known that $V_{OUT}$ is in a linear relationship with Vc. Therefore, the voltage $V_{OUT}$ at the voltage input end of the power amplifier may be adjusted by adjusting Vc. In addition, the corresponding relationship between the control voltage Vc, the power rating of the power amplifier PA and working frequency point of the power amplifier PA, where the corresponding relationship is recorded in Table 1, may be stored on a board of the terminal including the power supply circuit of the power amplifier, specifically, stored in the storage chip of the terminal so that Vc may be adjusted according to a state of the power amplifier PA. A functional relationship exists between $V_{OUT}$ and Vc; and therefore $V_{OUT}$ may change according to a change of the power rating and/or working frequency point of the PA. When the power amplifier PA is in a certain state, $V_{OUT}$ may be adjusted to a minimum value in this state according to the value of Vc that corresponds to the state and is recorded in Table 1, under a prerequisite that the equipment satisfies the radio frequency index. Therefore, the efficiency of the PA is improved.

According to the power supply circuit of the power amplifier provided in the embodiment of the present invention, the control circuit is additionally set between the voltage input end of the power amplifier and the feedback pin of the direct current/direct current converter chip, and the control circuit is a differential amplifier circuit. The control voltage changes according to a change of the power rating and/or working frequency point of the power amplifier, and the voltage at the voltage input end of the PA is in a linear relationship with the control voltage. Therefore, when the power amplifier is in a certain state, the control voltage may control the voltage at the voltage input end of the PA to reach a minimum value that enables the equipment to satisfy the radio frequency index in this state. In this way, the efficiency of the PA may be improved and then the power loss of the terminal is reduced.

Embodiment 2

Figure 7:
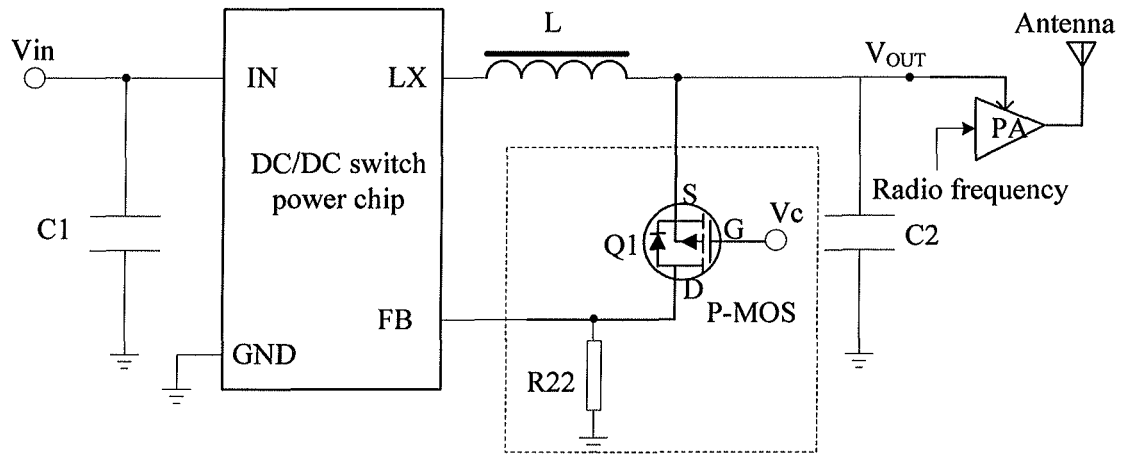
FIG. 7 is a circuit diagram of a power supply circuit of a power amplifier according to embodiment 2 of the present invention.

This embodiment provides a specific implementation of another power supply circuit of a power amplifier. As shown in FIG. 7, the technical solution provided in this embodiment differs from that provided in embodiment 1 only in the design of the control circuit. Other parts are similar and not detailed again here.

The control circuit in this embodiment is marked by a dotted box in FIG. 7. The control circuit includes a p-channel metal oxide semiconductor field effect transistor Q1 (P-MOSFET). Q1 in FIG. 7 is described by using an enhancement-mode P-MOSFET as an example, and for a circuit connection of a depletion-mode P-MOSFET, reference may also be made to FIG. 7. A source electrode S of Q1 is connected to the voltage input end of the power amplifier, and a drain electrode D is connected to a feedback pin FB of a direct current/direct current converter chip and is grounded through a resistor R22. A control voltage Vc is applied to a grid electrode G of Q1.

Assume that the on-resistance of Q1 is $R_{ON}$. Vc may be used to control Q1 to work in an amplified region. Therefore, the functional relationship between Vc and $R_{ON}$ is monotone. Specifically, for the enhancement-mode P-MOSFET in an amplified region, the functional relationship between Vc and $R_{ON}$ is a monotone increase, that is, the smaller Vc is, the smaller $R_{ON}$ is.

It is easy to find that the functional relationship between the voltage $V_{OUT}$ at the voltage input end of the PA and the on-resistance $R_{ON}$ is:

$$V_{OUT} = V_{FB} \cdot \frac{R_{22}}{R_{22} + R_{ON}};$$

and a functional relationship exists between Vc and $R_{ON}$, and the functional relationship is monotone. Therefore, the objective of adjusting $V_{OUT}$ may be achieved by adjusting Vc adaptively.

Figure 8:
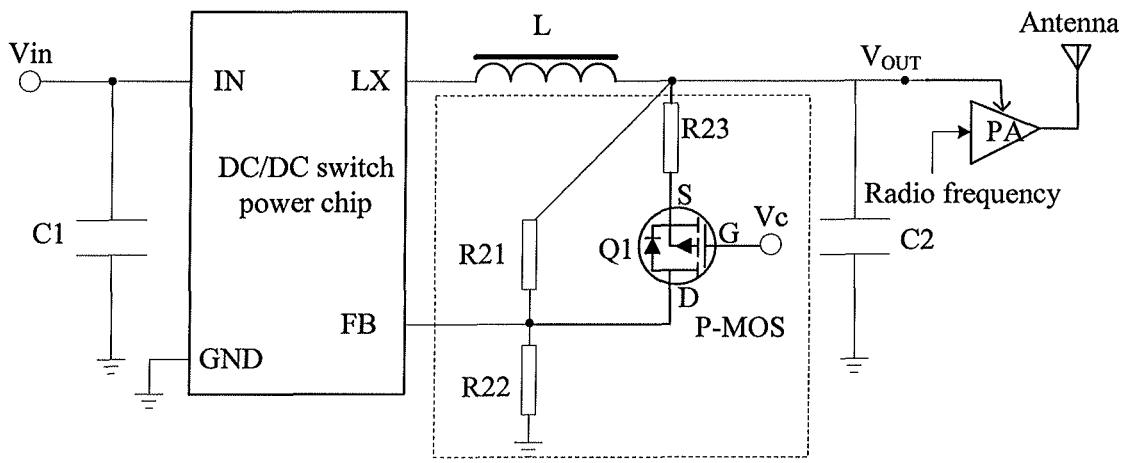
FIG. 8 is a circuit diagram of another power supply circuit of a power amplifier according to embodiment 2 of the present invention.

Further, the control circuit may be optimized according to FIG. 8 to reduce the requirement on the precision of Vc so as to facilitate the adjustment of Vc. The source S of Q1 is connected to the voltage input end of the PA through a resistor R23, and the voltage input end is connected to the feedback pin FB of the direct current/direct current converter chip through a resistor R21.

In this case, it is easy to find that the functional relationship between the voltage $V_{OUT}$ at the voltage input end of the PA and the on-resistance $R_{ON}$ is:

$$V_{OUT} = V_{FB} \cdot \frac{R_{22}}{R_{22} + R_{21} // (R_{23} + R_{ON})};$$

Similarly, a functional relationship exists between Vc and $R_{ON}$, and the functional relationship is monotone. Therefore, the objective of adjusting $V_{OUT}$ may be achieved by adjusting Vc.

In addition, similarly to embodiment 1, the corresponding relationship between data recorded in Table 1 may be stored on a board (which may specifically be a storage chip) of the terminal, so that Vc corresponding to a certain state is searched out according to the power rating and working frequency point of the power amplifier PA and then $V_{OUT}$ is adjusted.

In the power supply circuit of the power amplifier provided in the embodiment of the present invention, the control circuit is additionally set between the voltage input end of the power amplifier and the feedback pin of the direct current/direct current converter chip, and the control circuit includes a P-MOSFET. The control voltage changes according to the change of the power rating and/or working frequency point of the power amplifier and makes the P-MOSFET conduct, and the on-resistance of the P-MOSFET is in a functional relationship with the voltage at the voltage input end of the power amplifier PA. Therefore, when the power amplifier is in a certain state, the control voltage may control the voltage at the voltage input end of the power amplifier to reach a minimum value that enables the equipment to satisfy the radio frequency index in this state. Thereby, the efficiency of the power amplifier may be improved and then the power loss of the terminal is reduced.

Embodiment 3

Figure 9:
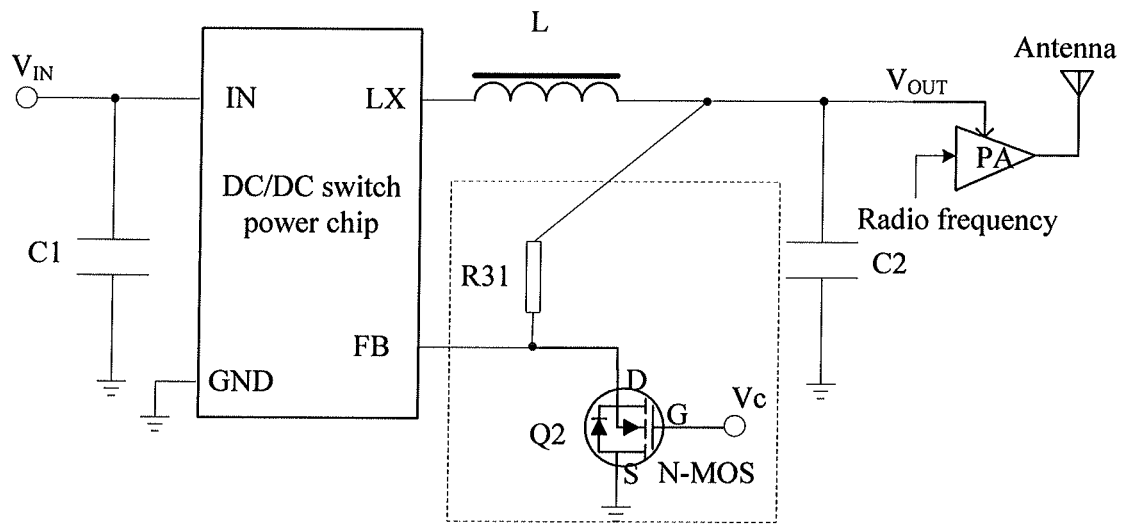
FIG. 9 is a circuit diagram of a power supply circuit of a power amplifier according to embodiment 3 of the present invention.

This embodiment provides a specific implementation of a power supply circuit of a power amplifier. As shown in FIG. 9, the technical solution provided in this embodiment differs from that provided in embodiment 1 only in the design of the control circuit. Other parts are similar and not detailed again here.

The control circuit in this embodiment is marked by a dotted box in FIG. 9. The control circuit includes an n-channel metal oxide semiconductor field effect transistor Q2 (N-MOSFET). Q2 in FIG. 9 is described by using an enhancement-mode N-MOSFET as an example, and for a circuit connection of a depletion-mode N-MOSFET, reference may also be made to FIG. 9. A source electrode S of Q2 is grounded, a drain electrode D is connected to a feedback pin FB of a direct current/direct current converter chip, and a control voltage Vc is applied to a grid electrode G of Q2. In addition, the voltage input end of the power amplifier PA is connected to the feedback pin FB of the direct current/direct current converter chip through a resistor R31.

Assume that the on-resistance of Q2 is $R_{ON}$. In this case, Vc may be used to control Q2 to work in an amplified region. Therefore, the functional relationship between Vc and $R_{ON}$ is monotone. Specifically, for the enhancement-mode N-MOSFET in an amplified region, the functional relationship between Vc and $R_{ON}$ is a monotone decrease, i.e., the larger Vc is, the smaller $R_{ON}$ is.

it is easy to find that the functional relationship between the voltage $V_{OUT}$ at the voltage input end of the power amplifier PA and the on-resistance $R_{ON}$ is:

$$V_{OUT} = V_{FB} \cdot \frac{R_{31} + R_{ON}}{R_{ON}};$$

and a functional relationship exists between Vc and $R_{ON}$, and the functional relationship is monotone. Therefore, the objective of adjusting $V_{OUT}$ may be achieved by adjusting Vc adaptively.

Figure 10:
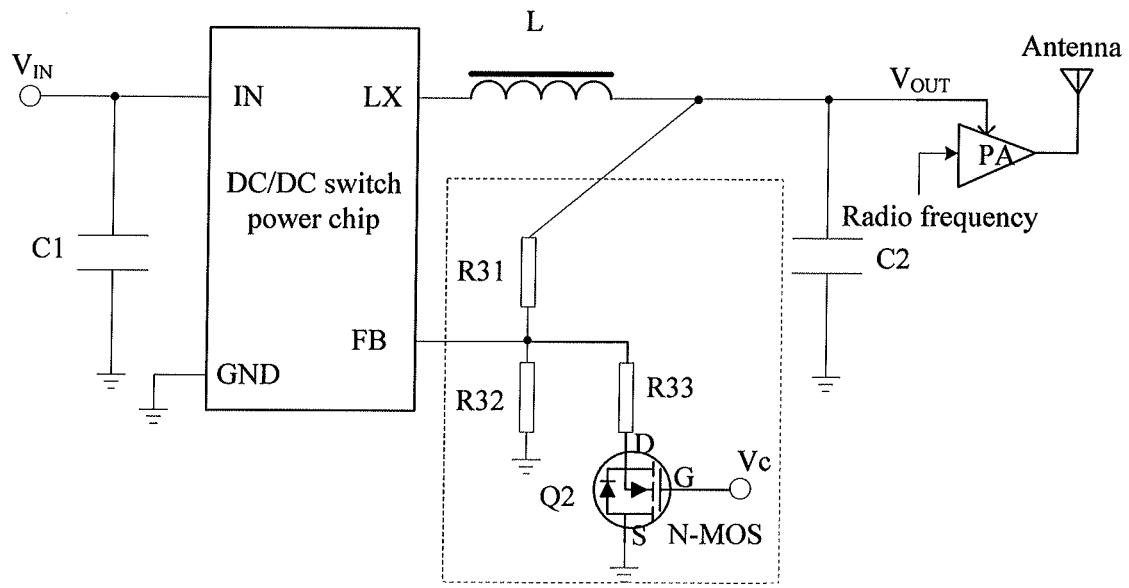
FIG. 10 is a circuit diagram of another power supply circuit of a power amplifier according to embodiment 3 of the present invention.

Further, the control circuit may be optimized according to FIG. 10 to reduce the requirement on the precision of Vc so as to facilitate the adjustment of Vc. The drain electrode D of Q2 is connected to the feedback pin FB of the direct current/direct current converter chip through a resistor R33, and the feedback pin FB is grounded through a resistor R32.

In this case, it is easy to find that the functional relationship between the voltage $V_{OUT}$ at the voltage input end of the power amplifier PA and the on-resistance $R_{ON}$ is:

$$V_{OUT} = V_{FB} \cdot \left[1 + \frac{R_{31}}{R_{32} // (R_{33} + R_{ON})}\right];$$

similarly, a functional relationship exists between Vc and $R_{ON}$, and the functional relationship is monotone. Therefore, the objective of adjusting $V_{OUT}$ may be achieved by adjusting Vc adaptively.

In addition, similarly to embodiment 1, the corresponding relationship between data recorded in Table 1 may be stored on a board (which may specifically be a storage chip) of the terminal, so that Vc corresponding to a certain state is searched out according to the power rating and working frequency point of the power amplifier PA and then $V_{OUT}$ is adjusted.

In the power supply circuit of the power amplifier provided in the embodiment of the present invention, a control circuit is additionally set between the voltage input end of the power amplifier and the feedback pin of the direct current/direct current converter chip, and the control circuit includes an N-MOSFET. The control voltage may change according to the change of the power rating and/or working frequency point of the power amplifier and makes the N-MOSFET become conductive, and the on-resistance of the N-MOSFET is in a functional relationship with the voltage at the voltage input end of the power amplifier PA. Therefore, when the power amplifier is in a certain state, the control voltage may control the voltage at the voltage input end of the PA to reach a minimum value that enables the equipment to satisfy the radio frequency index in this state. Thereby, the efficiency of the PA may be improved and then the power loss of the terminal is reduced.

Figure 11:
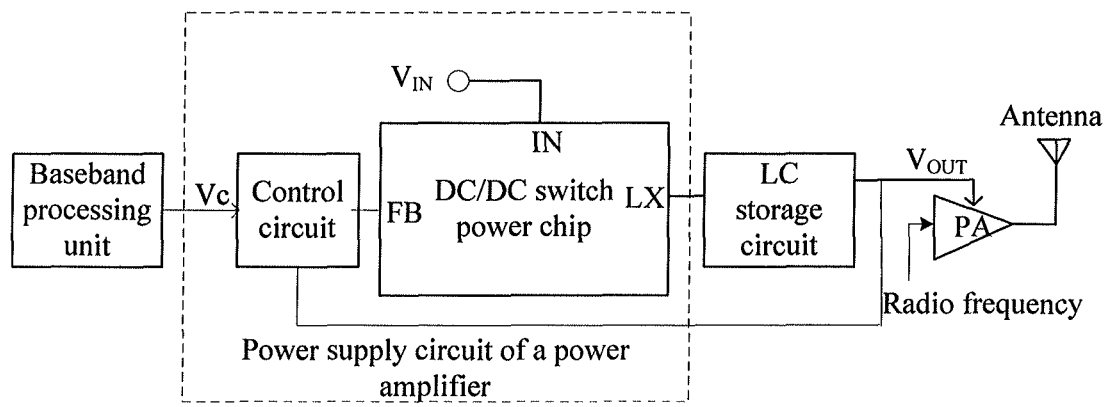
FIG. 11 is a schematic structural diagram of a terminal according to an embodiment of the present invention.

An embodiment of the present invention also provides a terminal. As shown in FIG. 11, the terminal includes a baseband processing unit, a power amplifier PA and a power supply circuit of the power amplifier. The power supply circuit of the power amplifier includes a direct current/direct current converter chip (that is, a DC/DC switch power chip). The direct current/direct current converter chip includes an input pin IN, an inductance pin LX, and a feedback pin FB. The input pin IN is connected to a power supply and the inductance pin LX is connected to a voltage input end of the power amplifier PA through an LC storage circuit. A control circuit is connected between the voltage input end of the power amplifier PA and the feedback pin FB, and the control circuit includes a control voltage Vc.

The baseband processing unit is configured to adjust the control voltage Vc, and the control voltage Vc adjusts the voltage $V_{OUT}$ at the voltage input end of the PA through the control circuit.

In the terminal provided in the embodiment of the present invention, the baseband processing unit adjusts the control voltage and the control voltage may adjust, through the control circuit, the voltage at the voltage input end of the power amplifier PA, so that the voltage at the voltage input end of the PA changes according to actual requirement. Thereby, the efficiency of the power amplifier PA may be improved and the power loss of the terminal is reduced.

Figure 12:
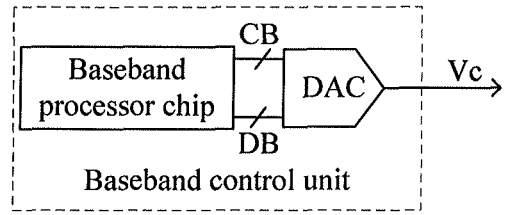
FIG. 12 is a schematic structural diagram of a baseband processing unit in FIG. 11.

Further, as shown in FIG. 12, the baseband processing unit includes a baseband processor chip and a DAC (Digital-to-Analog Converter, digital-to-analog converter). The baseband processor chip controls the DAC to adjust the control voltage Vc. In practical applications, the DAC may be integrated in the baseband processor chip.

Figure 13:
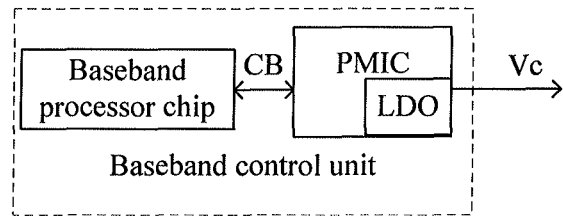
FIG. 13 is another schematic structural diagram of the baseband processing unit in FIG. 11.

Alternatively, as shown in FIG. 13, the baseband processing unit includes a baseband processor chip and a PMIC (Power Management IC, power management IC). The baseband processor chip controls the low dropout regulator LDO (Low Dropout Regulator) of the PMIC to adjust the control voltage Vc.

Further, a corresponding relationship exists between the control voltage Vc, the power rating of the power amplifier PA and working frequency point of the power amplifier PA. Specifically, reference may be made to Table 1.

Figure 14:
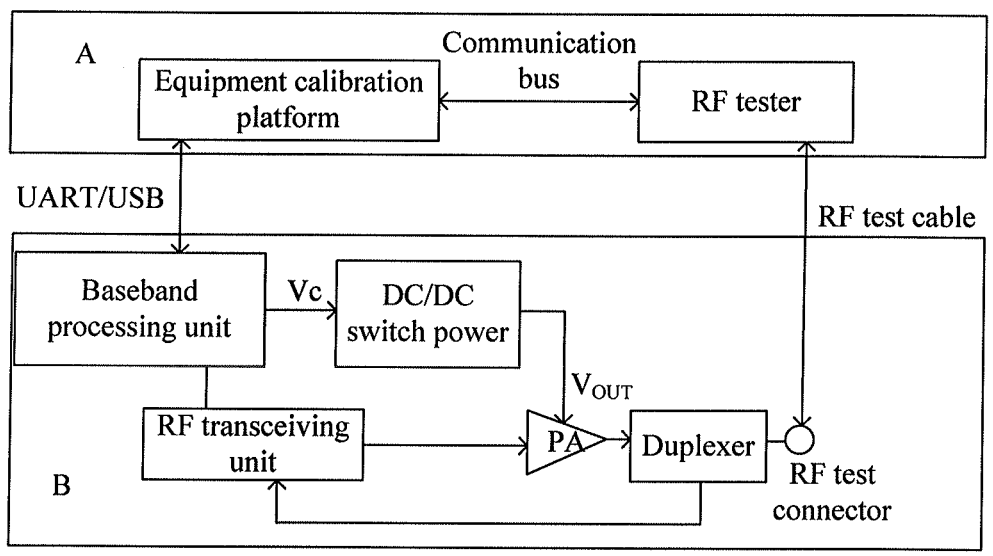
FIG. 14 is a schematic diagram of a calibration system according to the method shown in FIG. 4.

In addition, during manufacture, a system shown in FIG. 14 may be constructed to calibrate the control voltage Vc, where part A shows an RF (Radio Frequency, radio frequency) tester used in calibration, and an equipment calibration platform, and between the two is a communication bus, for example, a GPIB (General-Purpose Interface Bus, general-purpose interface bus) or Ethernet. The equipment calibration platform may be a computer having calibration software installed. Part B shows the terminal in the embodiment of the present invention. In addition, the RF tester is connected to the RF test connector in the terminal through an RF test cable. The RF tester is configured to test whether the radio frequency amplified by the power amplifier PA satisfies the radio frequency index. The equipment calibration platform controls the terminal or reads the information of the terminal through an asynchronous bus UART (Universal Asynchronous Receiver/Transmitter, universal asynchronous receiver/transmitter) or USB.

Figure 4:
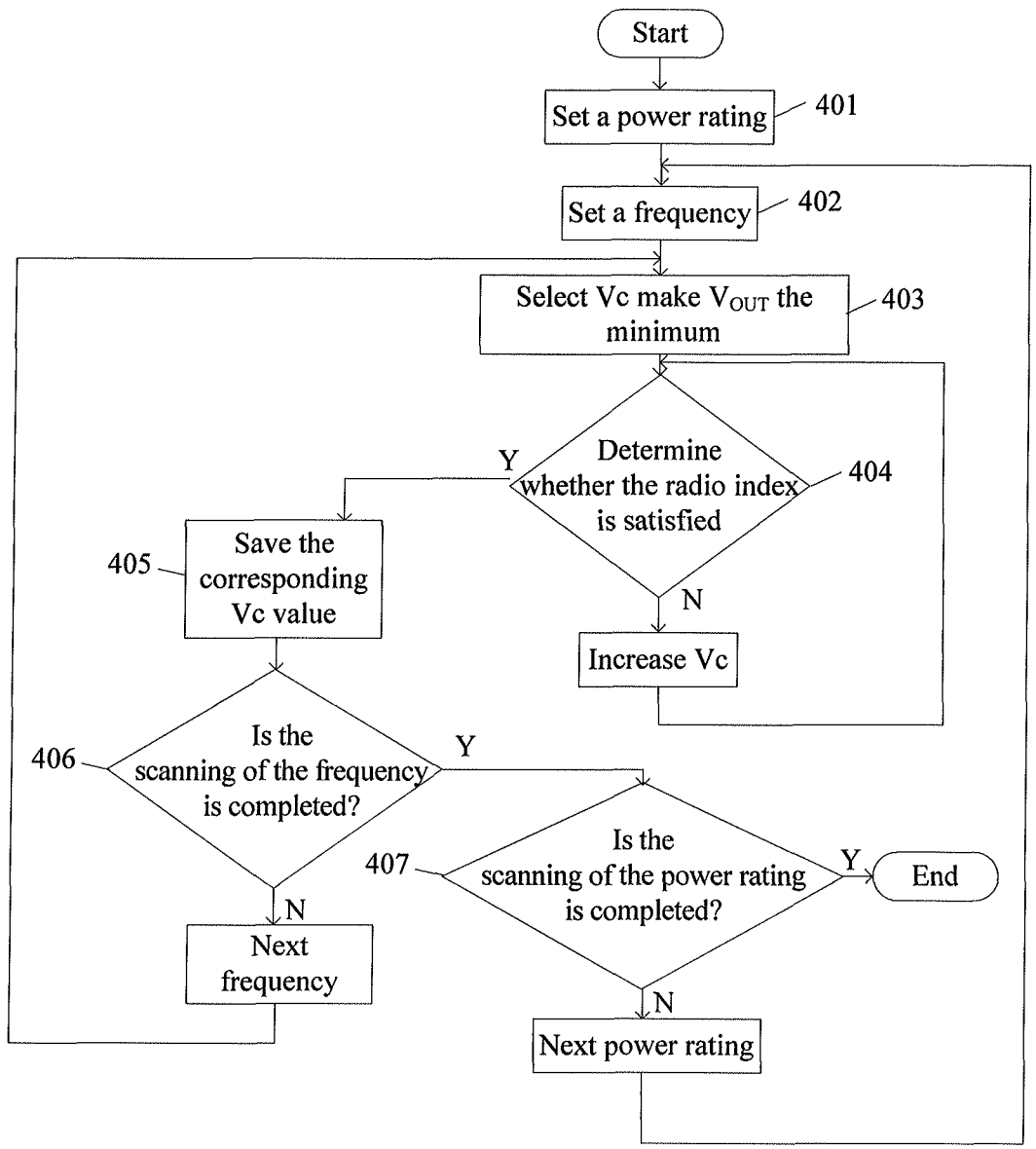
FIG. 4 is a flowchart of a method for calibrating a control voltage.

The equipment calibration platform may use the calibration software to execute the method for calibrating Vc as shown in FIG. 4, so as to determine Vc corresponding to each working frequency point of the PA at different power ratings to complete calibration of all values of Vc in Table 1. The corresponding relationship between the control voltage Vc, the power rating of the power amplifier PA and working frequency point of the PA recorded in Table 1 can be stored on a board (which may specifically be a storage chip) of the terminal, so that the Vc can be adjusted according to a state of the power amplifier PA.

In the terminal provided in the embodiment of the present invention, the baseband processing unit adjusts the control voltage, and the control voltage may adjust, through the control circuit, the voltage at the voltage input end of the power amplifier PA. Therefore, when the power amplifier PA is in a certain state, the voltage at the voltage input end of the PA may be adjusted to a minimum value that enables the entire equipment to satisfy the radio frequency index in this state. Thereby, the efficiency of the power amplifier PA may be improved and then the power loss of the terminal is reduced.

Embodiment 4

This embodiment provides a specific implementation of a terminal.

The terminal includes a baseband processing unit, a power amplifier PA and a power supply circuit of the power amplifier. The power supply circuit of the power amplifier includes a direct current/direct current converter chip (that is, a DC/DC switch power chip). The direct current/direct current converter chip includes an input pin IN, an inductance pin LX, and a feedback pin FB. The input pin IN is connected to a power supply and the inductance pin LX is connected to a voltage input end of the power amplifier PA through an LC storage circuit. A control circuit is connected between the voltage input end of the power amplifier PA and the feedback pin FB, and the control circuit includes a control voltage Vc.

The baseband processing unit is configured to adjust the control voltage Vc, and the control voltage Vc adjusts, through the control circuit, the voltage $V_{OUT}$ at the voltage input end of the power amplifier PA.

As shown in FIG. 12, the baseband processing unit includes a baseband processor chip and a DAC (Digital-to-Analog Converter, digital-to-analog converter). The baseband processor chip controls the DAC to adjust the control voltage Vc. In practical applications, the DAC may be integrated in the baseband processor chip.

Alternatively, as shown in FIG. 13, the baseband processing unit includes a baseband processor chip and a PMIC (Power Management IC, power management IC). The baseband processor chip controls the low dropout regulator LDO (Low Dropout Regulator) of the PMIC to adjust the control voltage Vc.

In this specific embodiment, for the power supply circuit of the power amplifier in the terminal, reference may be made to FIG. 5, where the control circuit is marked by a dotted box. The control circuit includes a differential amplifier circuit, and the differential amplifier includes an operational amplifier U2.

A non-inverting input end of the operational amplifier U2 is connected to the voltage input end of the power amplifier PA through a first resistor R11, and the non-inverting input end is grounded through a second resistor R12.

The control voltage Vc is applied to the inverting input end of the operational amplifier U2 through a third resistor R13, and the inverting input end is connected to the output end of the operational amplifier U2 through a fourth resistor R14, which forms a feedback loop.

The output end of the operational amplifier U2 is connected to the feedback pin FB of the direct current/direct current converter chip U1.

According to the above design of the power supply circuit of the power amplifier, the following relational expressions may be obtained. In the relational expressions, $V_-$ indicates the voltage at the inverting input end of the operational amplifier U2, $V_+$ indicates the voltage at the non-inverting input end of the operational amplifier U2, and Vo indicates the voltage at the output end of the operational amplifier U2.

$$\begin{cases} V_+ = \dfrac{R12}{R11+R12} V_{OUT}; \\ \dfrac{Vc - V_-}{R13} = \dfrac{V_- - Vo}{R14}; \\ V_+ = V_-; \\ Vo = V_{FB}; \end{cases}$$

From the above expressions, a relational expression between the $V_{OUT}$ and Vc is finally obtained:

$$V_{OUT} = \frac{R14(R11+R12)}{R12(R13+R14)}Vc + \frac{R13(R11+R12)}{R12(R13+R14)}V_{FB};$$

and in this expression, $V_{FB}$ is a fixed value. Therefore, it is easy to find that $V_{OUT}$ is in a linear relationship with Vc.

Further, referring to FIG. 6, the differential amplifier circuit in the power supply circuit of the power amplifier as shown in FIG. 5 is optimized. The output end of the operational amplifier U2 is connected to the feedback pin FB of the direct current/direct current converter chip U1 through a resistor R15, and the feedback pin FB is grounded through a resistor R16.

In this case, the following relational expressions may be obtained:

$$\begin{cases} V_+ = \frac{R12}{R11+R12}V_{OUT}; \\ \frac{Vc-V_-}{R13} = \frac{V_- Vo}{R14}; \\ V_+ = V_-; \\ V_{FB} = \frac{R16}{R15+R16}Vo; \end{cases}$$

From the above expressions, a relational expression between the $V_{OUT}$ and Vc may be obtained:

$$V_{OUT} = \frac{R14(R11+R12)}{R12(R13+R14)}Vc + \frac{R13(R11+R12)(R15+R16)}{R12 \cdot R16(R13+R14)}V_{FB};$$

and in this relational expression, $V_{FB}$ is a fixed value. Therefore, it can be concluded that the $V_{OUT}$ is in a linear relationship with Vc.

Further, in the design of the differential amplifier circuit, generally, the resistance of the first resistor R11 is equal to that of the third resistor R13, and the resistance of the second resistor R12 is equal to that of the fourth resistor R14.

In this case, as regards the power supply circuit of the PA shown in FIG. 6, a final relational expression between the $V_{OUT}$ and the Vc is obtained:

$$V_{OUT} = Vc + \frac{R13(R15+R16)}{R12 \cdot R16}V_{FB};$$

and in this expression, $V_{FB}$ is a fixed value. Therefore, it may be known that the $V_{OUT}$ is in a linear relationship with Vc. Therefore, the voltage $V_{OUT}$ at the voltage input end of the PA may be adjusted by adjusting the Vc.

In addition, the corresponding relationship between the control voltage Vc, the power rating of the power amplifier PA and working frequency point of the power amplifier PA, where the corresponding relationship is recorded in Table 1, may be stored on a board (which may specifically be a storage chip) of the terminal, so that Vc may be adjusted according to a state of the power amplifier PA. A functional relationship exists between $V_{OUT}$ and Vc; and therefore the $V_{OUT}$ may change according to a change of the power rating and/or working frequency point of the power amplifier PA. When the PA is in a certain state, $V_{OUT}$ of the PA in this state can be adjusted to a minimum value according to the value of Vc that corresponds to the state and is recorded in Table 1, under a prerequisite that the equipment satisfies the radio frequency index. Therefore, the efficiency of the PA can be improved.

In the terminal provided in the embodiment of the present invention, a control circuit is additionally set between the voltage input end of the power amplifier and the feedback pin of the direct current/direct current converter chip, and the control circuit is a differential amplifier circuit. The control voltage may change according to the change of the power rating and/or working frequency point of the power amplifier, and the voltage at the voltage input end of the PA is in a linear relationship with the control voltage. Therefore, when the PA is in a certain state, the control voltage may control the voltage at the voltage input end of the PA to reach a minimum value that enables the entire equipment to satisfy the radio frequency index in this state. Thereby, the efficiency of the power amplifier may be improved and the power loss of the terminal is reduced.

Embodiment 5

This embodiment provides a specific implementation of another terminal. for a power supply circuit of a power amplifier in the technical solution provided in this specific embodiment, reference may be made to FIG. 7, where the technical solution provided in this embodiment differs from that provided in the fourth embodiment only in the design of the control circuit. Other parts are similar to those in embodiment 4 and not detailed here.

The control circuit in this embodiment includes a p-channel metal oxide semiconductor field effect transistor Q1 (P-MOSFET). Q1 in FIG. 7 is described by using an enhancement-mode P-MOSFET as an example, and for a circuit connection of a depletion-mode P-MOSFET, reference may also be made to FIG. 7. A source electrode S of Q1 is connected to the voltage input end of the power amplifier, and a drain electrode D is connected to a feedback pin FB of a direct current/direct current converter chip and is grounded through a resistor R22. A control voltage Vc is applied to a grid electrode G of Q1.

Assume that the on-resistance of Q1 is $R_{ON}$. In this case, Vc may be used to control Q1 to work in an amplified region. Therefore, a functional relationship between Vc and $R_{ON}$ is monotone. Specifically, for the enhancement-mode P-MOSFET in the amplified region, the functional relationship between Vc and $R_{ON}$ is a monotone increase, i.e., the smaller Vc is, the smaller $R_{ON}$ is.

It is easy to find that a functional relationship between the voltage $V_{OUT}$ at the voltage input end of the PA and the on-resistance $R_{ON}$ is:

$$V_{OUT} = V_{FB} \cdot \frac{R22}{R22+R_{ON}};$$

and a functional relationship exists between Vc and $R_{ON}$, and the functional relationship is monotone. Therefore, the objective of adjusting $V_{OUT}$ may be achieved by adjusting Vc adaptively.

Further, the control circuit may be optimized according to FIG. 8 to reduce the requirement on precision of Vc so as to facilitate the adjustment of Vc. The source electrode S of Q1 is connected to the voltage input end of the PA through a resistor R23, and the voltage input end is connected to the feedback pin FB of the direct current/direct current converter chip through a resistor R21.

In this case, it is easy to find that a functional relationship between the voltage $V_{OUT}$ at the voltage input end of the PA and the on-resistance $R_{ON}$ is:

$$V_{OUT} = V_{FB} \cdot \frac{R_{22}}{R_{22} + R_{21} // (R_{23} + R_{ON})};$$

and similarly, a functional relationship exists between Vc and $R_{ON}$, and the functional relationship is monotone. Therefore, the objective of adjusting $V_{OUT}$ may be achieved by adjusting Vc.

In addition, the corresponding relationship between data recorded in Table 1 may be stored on a board (which may specifically be a storage chip) of the terminal, so that Vc corresponding to a certain state is searched out according to the power rating and working frequency point of the PA and then $V_{OUT}$ is adjusted.

In the terminal provided in the embodiment of the present invention, a control circuit is additionally set between the voltage input end of the power amplifier and the feedback pin of the direct current/direct current converter chip, and the control circuit includes a P-MOSFET. The control voltage may change according to the change of the power rating and/or working frequency point of the power amplifier and makes the P-MOSFET become conductive, and the on-resistance of the P-MOSFET is in a functional relationship with the voltage at the voltage input end of the power amplifier PA. Therefore, the control voltage may control the voltage at the voltage input end of the PA to reach a minimum value that enables the entire equipment to satisfy the radio frequency index in a certain state. Thereby, the efficiency of the power amplifier may be improved and the power loss of the terminal is reduced.

Embodiment 6

This embodiment provides a specific implementation of a terminal. For the power supply circuit of the power amplifier in the technical solution provided in this embodiment, reference may be made to FIG. 9. As shown in FIG. 7, the technical solution provided in this embodiment differs from that provided in the fourth embodiment only in the design of the control circuit. Other parts are similar to those in embodiment 4 and not detailed here.

The control circuit in this embodiment includes an n-channel metal oxide semiconductor field effect transistor Q2 (N-MOSFET). Q2 in FIG. 9 is described by using an enhancement-mode N-MOSFET as an example, and for a circuit connection of a depletion-mode N-MOSFET, reference may be made to FIG. 9. A source electrode S of the Q2 is grounded, a drain electrode D of the Q2 is connected to a feedback pin FB of a direct current/direct current converter chip, and a control voltage Vc is applied to a grid electrode G of the Q2. In addition, the voltage input end of the power amplifier PA is connected to the feedback pin FB of the direct current/direct current converter chip by using a resistor R31.

Assume that the on-resistance of Q2 is $R_{ON}$. In this case, Vc may be used to control Q2 to work in an amplified region. Therefore, a functional relationship between Vc and $R_{ON}$ is monotone. Specifically, for the enhancement-mode N-MOSFET in the amplified region, the functional relationship between Vc and $R_{ON}$ is a monotone decrease, i.e., the larger Vc is, the smaller $R_{ON}$ is.

It is easy to find that a functional relationship between the voltage $V_{OUT}$ at the voltage input end of the PA and the on-resistance $R_{ON}$ is:

$$V_{OUT} = V_{FB} \cdot \frac{R_{31} + R_{ON}}{R_{ON}};$$

and a functional relationship exists between Vc and $R_{ON}$, and the functional relationship is monotone. Therefore, the objective of adjusting $V_{OUT}$ may be achieved by adjusting Vc adaptively.

Further, the control circuit may be optimized according to FIG. 10 to reduce the precision requirement of Vc so as to facilitate adjustment of the Vc. The drain electrode D of Q2 is connected to the feedback pin FB of the direct current/direct current converter chip through a resistor R33, and the feedback pin FB is grounded through a resistor R32.

In this case, it is easy to find that the functional relationship between the voltage $V_{OUT}$ at the voltage input end of the PA and the on-resistance $R_{ON}$ is:

$$V_{OUT} = V_{FB} \cdot \left[1 + \frac{R_{31}}{R_{32} // (R_{33} + R_{ON})}\right];$$

and similarly, a functional relationship exists between Vc and $R_{ON}$, and the functional relationship is monotone. Therefore, the objective of adjusting $V_{OUT}$ may be achieved by adjusting Vc adaptively.

In addition, the corresponding relationship between data recorded in Table 1 may be stored on a board (which may specifically be a storage chip) of the terminal, so that Vc corresponding to a certain state is searched out according to the power rating and working frequency point of the PA and that $V_{OUT}$ is adjusted.

In the terminal provided in the embodiment of the present invention, a control circuit is additionally set between the voltage input end of the power amplifier and the feedback pin of the direct current/direct current converter chip, and the control circuit includes an N-MOSFET. The control voltage may change according to the change of the power rating and/or working frequency point of the power amplifier and make the N-MOSFET become conductive, and the on-resistance of the N-MOSFET is in a functional relationship with the voltage at the voltage input end of the power amplifier PA. Therefore, the control voltage may control the voltage at the voltage input end of the power amplifier to reach a minimum value that enables the equipment to satisfy the radio frequency index in a certain state. Thereby, the efficiency of the power amplifier may be improved and then the power loss of the terminal is reduced.

Through the above description of the implementation manners, those skilled in the art can clearly understand that the present invention may be implemented by using software in combination with necessary hardware or by hardware only. However, in most cases, the former is a preferable implementation manner. Based on such understandings, the technical solutions in the present invention or the portions contributing to the prior art may be essentially embodied in the form of a software product. The software product may be stored in a readable storage medium such as a floppy disk, a hard disk, or an optical disk of a computer, and includes several instructions that enable a computer device (which may be a personal computer, a server, or a network device) to execute the methods in the embodiments of the present invention.

Described above are merely specific implementation manners of the present invention. The protection scope of the present invention is not limited thereto. Variations or replacements readily figured out by persons skilled in the prior art in the technical scope disclosed herein shall fall within the protection scope of the present invention. Therefore, the scope of the present invention is subjected to the appended claims.

What is claimed is:

1. A power supply circuit of a power amplifier, comprising a direct current/direct current converter chip, wherein the direct current/direct current converter chip comprises an input pin, an inductance pin, and a feedback pin, and the input pin is configured to connect to a power supply and the inductance pin is connected to a voltage input end of the power amplifier through an LC storage circuit, wherein a control circuit is connected between the voltage input end of the power amplifier and the feedback pin; and the control circuit comprises a control voltage, wherein the control voltage adjusts, through the control circuit, the voltage at the voltage input end of the power amplifier, and wherein the control voltage is variable according to a calculated value of at least one of a power rating of the power amplifier PA and working frequency point of the power amplifier, wherein a corresponding relationship exists between the control voltage, the power rating of the power amplifier PA and working frequency point of the power amplifier.

2. The power supply circuit of the power amplifier according to claim 1, wherein the control circuit comprises a differential amplifier circuit, and the differential amplifier circuit comprises an operational amplifier;

a non-inverting input end of the operational amplifier is connected to the voltage input end of the power amplifier through a first resistor, and the non-inverting input end is grounded through a second resistor; and the control voltage is applied to an inverting input end of the operational amplifier through a third resistor, and the inverting input end is connected to an output end of the operational amplifier through a fourth resistor, which forms a feedback loop; and the output end of the operational amplifier is connected to the feedback pin of the direct current/direct current converter chip.

3. The power supply circuit of the power amplifier according to claim 2, wherein the output end of the operational amplifier is connected to the feedback pin of the direct current/direct current converter chip through a resistor, and the feedback pin is grounded through a resistor.

4. The power supply circuit of the power amplifier according to claim 2, wherein resistance of the first resistor is equal to that of the third resistor, and resistance of the second resistor is equal to that of the fourth resistor.

5. A power supply circuit of a power amplifier, comprising a direct current/direct current converter chip, wherein the direct current/direct current converter chip comprises an input pin, an inductance pin, and a feedback pin, and the input pin is configured to connect to a power supply and the inductance pin is connected to a voltage input end of the power amplifier through an LC storage circuit, wherein a control circuit is connected between the voltage input end of the power amplifier and the feedback pin; and the control circuit comprises a control voltage, wherein the control voltage adjusts, through the control circuit, the voltage at the voltage input end of the power amplifier, and wherein the control voltage is variable, wherein the control circuit comprises a p-channel metal oxide semiconductor field effect transistor; wherein:

a source electrode of the p-channel metal oxide semiconductor field effect transistor is connected to the voltage input end of the power amplifier;

a drain electrode of the p-channel metal oxide semiconductor field effect transistor is connected to the feedback pin of the direct current/direct current converter chip and the drain electrode of the p-channel metal oxide semiconductor field effect transistor is grounded through a resistor; and the control voltage is applied to a grid electrode of the p-channel metal oxide semiconductor field effect transistor.

6. The power supply circuit of the power amplifier according to claim 5, wherein the source electrode of the p-channel metal oxide semiconductor field effect transistor is connected to the voltage input end of the power amplifier through a resistor, and the voltage input end is connected to the feedback pin of the direct current/direct current converter chip through a resistor.

7. The power supply circuit of the power amplifier according to claim 1, wherein the control circuit comprises an n-channel metal oxide semiconductor field effect transistor; wherein:

a source electrode of the n-channel metal oxide semiconductor field effect transistor is grounded;

a drain electrode of the n-channel metal oxide semiconductor field effect transistor is connected to the feedback pin of the direct current/direct current converter chip;

the control voltage is applied to a grid electrode of the ne-channel metal oxide semiconductor field effect transistor; and the voltage input end of the power amplifier is connected to the feedback pin of the direct current/direct current converter chip through a resistor.

8. The power supply circuit of the power amplifier according to claim 7, wherein the drain electrode of the n-channel metal oxide semiconductor field effect transistor is connected to the feedback pin of the direct current/direct current converter chip through a resistor, and the feedback pin is grounded through a resistor.

9. The power supply circuit of the power amplifier according to claim 1, wherein the LC storage circuit comprises an inductance and a capacitor; and the inductance is connected to the inductance pin of the direct current/direct current converter chip and the voltage input end of the power amplifier, and the voltage input end of the power amplifier is grounded through the capacitor.

10. A terminal, comprising a baseband processing unit, a power supply circuit of the power amplifier and a power amplifier, wherein the power supply circuit of the power amplifier comprises a direct current/direct current converter chip, wherein the direct current/direct current converter chip comprises an input pin, an inductance pin, and a feedback pin, and the input pin is configured to connect to a power supply and the inductance pin is connected to a voltage input end of the power amplifier through an LC storage circuit, wherein a control circuit is connected between the voltage input end of the power amplifier and the feedback pin, and the control circuit comprises a control voltage; and wherein:

the baseband processing unit is configured to adjust the control voltage, and control circuit is configured to calculate value for at least one of the power rating and working frequency point of the power amplifier, wherein a corresponding relationship exists between the control voltage, a power rating of the power amplifier PA and working frequency point of the power amplifier, and adjust the voltage at the voltage input end of the power amplifier according to the calculated value.

11. The terminal according to claim 10, wherein the baseband processing unit comprises a baseband processor chip and a digital-to-analog converter, and the adjusting the control voltage by the baseband processing unit is specifically that the baseband processor chip adjusts the control voltage through the digital-to-analog converter; or the baseband processing unit comprises a baseband processor chip and a power management integrated circuit, and the adjusting the control voltage by the baseband processing unit is specifically that the baseband processor chip adjusts the control voltage through a low dropout linear regulator of the power management integrated circuit.

12. The terminal according to claim 10, wherein the control circuit comprises a differential amplifier circuit, and the differential amplifier circuit comprises an operational amplifier; and a non-inverting input end of the operational amplifier is connected to the voltage input end of the power amplifier through a first resistor, and the non-inverting input end is grounded through a second resistor;

the control voltage is applied to an inverting input end of the operational amplifier through a third resistor, and the inverting input end is connected to an output end of the operational amplifier through a fourth resistor, which forms a feedback loop; and the output end of the operational amplifier is connected to the feedback pin of the direct current/direct current converter chip.

13. The terminal according to claim 12, wherein the output end of the operational amplifier is connected to the feedback pin of the direct current/direct current converter chip through a resistor, and the feedback pin is grounded through a resistor.

14. The terminal according to claim 10, wherein the control circuit comprises a p-channel metal oxide semiconductor field effect transistor; wherein:

a source electrode of the p-channel metal oxide semiconductor field effect transistor is connected to the voltage input end of the power amplifier;

a drain electrode of the p-channel metal oxide semiconductor field effect transistor is connected to the feedback pin of the direct current/direct current converter chip and the drain electrode of the p-channel metal oxide semiconductor field effect transistor is grounded through a resistor; and the control voltage is applied to a grid electrode of the p-channel metal oxide semiconductor field effect transistor.

15. The terminal according to claim 14, wherein the source of the p-channel metal oxide semiconductor field effect transistor is connected to the voltage input end of the power amplifier through a resistor, and the voltage input end is connected to the feedback pin of the direct current/direct current converter chip through a resistor.

16. The terminal according to claim 10, wherein the control circuit comprises an n-channel metal oxide semiconductor field effect transistor; wherein:

a source electrode of the n-channel metal oxide semiconductor field effect transistor is grounded;

a drain electrode of the n-channel metal oxide semiconductor field effect transistor is connected to the feedback pin of the direct current/direct current converter chip;

the control voltage is applied to a grid electrode of the n-channel metal oxide semiconductor field effect transistor; and the voltage input end of the power amplifier is connected to the feedback pin of the direct current/direct current converter chip through a resistor.

17. The terminal according to claim 16, wherein the drain electrode of the n-channel metal oxide semiconductor field effect transistor is connected to the feedback pin of the direct current/direct current converter chip through a resistor, and the feedback pin is grounded through a resistor.

* * * * *

UNITED STATES PATENT AND TRADEMARK OFFICE
CERTIFICATE OF CORRECTION

| | | |
|---|---|---|
| PATENT NO. | : 8,659,356 B2 | Page 1 of 1 |
| APPLICATION NO. | : 13/351999 | |
| DATED | : February 25, 2014 | |
| INVENTOR(S) | : Zexu Qian | |

It is certified that error appears in the above-identified patent and that said Letters Patent is hereby corrected as shown below:

In the Claims

In column 18, claim 10, line 63, before "control circuit is configured" insert --the--.

Signed and Sealed this
Eighth Day of July, 2014

Michelle K. Lee
*Deputy Director of the United States Patent and Trademark Office*